(12) United States Patent
Tsiang et al.

(10) Patent No.: US 10,199,388 B2
(45) Date of Patent: Feb. 5, 2019

(54) VNAND TENSILE THICK TEOS OXIDE

(71) Applicant: Applied Materials, Inc., Santa Clara, CA (US)

(72) Inventors: Michael Wenyoung Tsiang, Fremont, CA (US); Praket P. Jha, San Jose, CA (US); Xinhai Han, Santa Clara, CA (US); Bok Hoen Kim, San Jose, CA (US); Sang Hyuk Kim, Gyeonggi (KR); Myung Hun Ju, Gyeonggi-do (KR); Hyung Jin Park, Icheon (KR); Ryeun Kwan Kim, Wonju-Si (KR); Jin Chul Son, Hwa Sung-Si (KR); Saiprasanna Gnanavelu, Santa Clara, CA (US); Mayur G. Kulkarni, Sunnyvale, CA (US); Sanjeev Baluja, Campbell, CA (US); Majid K. Shahreza, San Jose, CA (US); Jason K. Foster, San Jose, CA (US)

(73) Assignee: APPLIED MATEERIALS, INC., Santa Clara, CA (US)

( * ) Notice: Subject to any disclaimer, the term of this patent is extended or adjusted under 35 U.S.C. 154(b) by 0 days.

(21) Appl. No.: 15/214,104

(22) Filed: Jul. 19, 2016

(65) Prior Publication Data

US 2017/0062469 A1 Mar. 2, 2017

Related U.S. Application Data

(60) Provisional application No. 62/210,808, filed on Aug. 27, 2015.

(51) Int. Cl.
*H01L 21/02* (2006.01)
*C23C 16/02* (2006.01)
(Continued)

(52) U.S. Cl.
CPC .... *H01L 27/11582* (2013.01); *C23C 16/0272* (2013.01); *C23C 16/402* (2013.01);
(Continued)

(58) Field of Classification Search
CPC ............ H01L 21/022; H01L 21/02211; H01L 21/02216; H01L 21/02321;
(Continued)

(56) References Cited

U.S. PATENT DOCUMENTS 5,633,211 A * 5/1997 Imai .................. C23C 16/401
257/E21.241
5,908,672 A * 6/1999 Ryu .................. C23C 16/345
257/E21.243

(Continued)

OTHER PUBLICATIONS

International Search Report and Written Opinion for International Application No. PCT/US2016/043181 dated Oct. 25, 2016.

*Primary Examiner* — Yu Chen
(74) *Attorney, Agent, or Firm* — Patterson + Sheridan LLP

(57) ABSTRACT

Embodiments of the present disclosure generally relate to an improved method for forming a dielectric film stack used for inter-level dielectric (ILD) layers in a 3D NAND structure. In one embodiment, the method comprises providing a substrate having a gate stack deposited thereon, forming on exposed surfaces of the gate stack a first oxide layer using a first RF power and a first process gas comprising a TEOS gas and a first oxygen-containing gas, and forming over the first oxide layer a second oxide layer using a second RF power and a second process gas comprising a silane gas and a second oxygen-containing gas.

10 Claims, 5 Drawing Sheets

(51) Int. Cl.
  *C23C 16/40* (2006.01)
  *C23C 16/455* (2006.01)
  *C23C 16/505* (2006.01)
  *C23C 16/52* (2006.01)
  *H01L 27/11582* (2017.01)
  *H01L 27/11556* (2017.01)
  *H01L 21/3115* (2006.01)
  *H01L 29/06* (2006.01)
  *H01L 21/768* (2006.01)
  *H01L 27/11548* (2017.01)
  *H01L 27/11575* (2017.01)
  *H01L 21/3105* (2006.01)
  *H01L 21/311* (2006.01)

(52) U.S. Cl.
  CPC ...... *C23C 16/45523* (2013.01); *C23C 16/505* (2013.01); *C23C 16/52* (2013.01); *H01L 21/022* (2013.01); *H01L 21/02164* (2013.01); *H01L 21/02211* (2013.01); *H01L 21/02216* (2013.01); *H01L 21/02274* (2013.01); *H01L 21/02304* (2013.01); *H01L 21/02321* (2013.01); *H01L 21/02337* (2013.01); *H01L 21/3115* (2013.01); *H01L 21/76801* (2013.01); *H01L 27/11548* (2013.01); *H01L 27/11556* (2013.01); *H01L 27/11575* (2013.01); *H01L 29/06* (2013.01); *H01L 21/31053* (2013.01); *H01L 21/31111* (2013.01)

(58) Field of Classification Search
  CPC ......... H01L 21/02304; H01L 27/11556; H01L 27/11582; H01L 27/11548; H01L 27/11575; H01L 21/02164; H01L 21/02274; H01L 21/3143; H01L 21/3144; H01L 21/3145; C23C 16/0272; C23C 16/029; C23C 16/402; C23C 16/505–16/5096; C23C 16/52; C23C 16/45523
  See application file for complete search history.

(56) References Cited

U.S. PATENT DOCUMENTS

| | | | |
|---|---|---|---|
| 6,013,584 | A | 1/2000 | M'Saad |
| 6,025,279 | A | 2/2000 | Chiang et al. |
| 6,121,164 | A | 9/2000 | Yieh et al. |
| 6,372,664 | B1 | 4/2002 | Jang et al. |
| 6,511,923 | B1 | 1/2003 | Wang et al. |
| 6,733,955 | B1 | 5/2004 | Geiger et al. |
| 6,828,255 | B2 | 12/2004 | Lai et al. |
| 7,157,331 | B2 | 1/2007 | Lu et al. |
| 7,273,823 | B2 | 9/2007 | Lakshmanan et al. |
| 7,544,625 | B2 | 6/2009 | Joshi et al. |
| 7,780,865 | B2 | 8/2010 | Balseanu et al. |
| 7,807,225 | B2 | 10/2010 | Joshi et al. |
| 8,508,997 | B2 | 8/2013 | Tang et al. |
| 8,937,021 | B2 | 1/2015 | Cho et al. |
| 2007/0155105 | A1 | 7/2007 | Seo et al. |
| 2011/0272745 | A1 | 11/2011 | Kiyotoshi et al. |
| 2012/0119303 | A1 | 5/2012 | JangJian et al. |
| 2012/0149213 | A1* | 6/2012 | Nittala .................. C23C 16/02 438/783 |
| 2015/0004796 | A1 | 1/2015 | Kim et al. |
| 2015/0008506 | A1* | 1/2015 | Yang ................. H01L 27/11582 257/324 |
| 2015/0206787 | A1 | 7/2015 | Murata et al. |
| 2016/0233232 | A1* | 8/2016 | Im ..................... H01L 27/11582 |

* cited by examiner

VNAND TENSILE THICK TEOS OXIDE

CROSS-REFERENCE TO RELATED APPLICATIONS

This application claims priority to U.S. provisional patent application Ser. No. 62/210,808, filed Aug. 27, 2015, which is herein incorporated by reference.

FIELD

Embodiments of the present disclosure generally relate to improved methods for deposition of dielectric film stack and dielectric film stack employed as inter-level dielectric (ILD) layers.

BACKGROUND

With continued pressure to make increasingly dense devices, the semiconductor device industry is switching to the use of three dimensional (3D) memory structures. For instance, NAND flash memory has moved from a planar configuration to a vertical configuration (VNAND). This vertical configuration permits the memory devices to be formed at significantly greater bit density. In manufacturing stacking of 3D semiconductor chips, stair-like structures are often utilized to allow multiple interconnection structures to be disposed thereon, forming high-density of vertical transistor devices. An inter-level dielectric (ILD) may be disposed over the stair-like structure between interconnection levels to isolate conductor layers disposed in interconnection levels. However, due to physical stress within the inter-level dielectric that may be caused by thermal expansion difference between the inter-level dielectric and the interconnection levels, cracks or defects are often introduced into the semiconductor chips, affecting the overall performance of the device.

Therefore, there is a need in the art to provide an improved method that inhibits the occurrence of cracks and defects in the semiconductor chips.

SUMMARY

Embodiments of the present disclosure generally relate to an improved method for forming a dielectric film stack used for inter-level dielectric (ILD) layers in a 3D NAND structure. In one embodiment, the method comprises providing a substrate having a gate stack deposited thereon, forming on exposed surfaces of the gate stack a first oxide layer using a first RF power and a first process gas comprising a TEOS gas and a first oxygen-containing gas, and forming over the first oxide layer a second oxide layer using a second RF power and a second process gas comprising a silane gas and a second oxygen-containing gas.

In another embodiment, the method comprises forming on a substrate a layer stack having a staircase cross section, covering exposed surfaces of the layer stack with a first oxide layer having a thickness of about 10000 angstroms to about 30000 angstroms and a tensile stress of about 80 MPa to about 300 MPa, the first oxide layer is formed using a TEOS gas flow rate of about 3000 to about 6500 milligrams per minute, an oxygen-containing gas flow rate of about 1200 sccm to about 21000 sccm, a carrier gas flow rate of about 1000 sccm to about 9000 sccm, the carrier gas comprising helium or argon, an RF power of about 150 W to about 850 W at a frequency of 13.56 MHz, a chamber temperature of about 350° C. to about 650° C., and a chamber pressure of about 2 Torr to about 14 Torr, forming over the first oxide layer a second oxide layer having a thickness of about 8000 angstroms to about 15000 angstroms, the second oxide layer is formed using a silane gas flow rate of about 100 sccm to about 600 sccm, an oxygen-containing gas flow rate of about 2500 sccm to about 8000 sccm, a carrier gas flow rate of about 1000 to about 9000 sccm, the carrier gas comprising helium or argon, an RF power of about 150 W to about 850 W at a frequency of 13.56 MHz, a chamber temperature of about 350° C. to about 650° C., and a chamber pressure of about 2 Torr to about 14 Torr, and subjecting the substrate to a thermal anneal treatment in a nitrogen rich environment at a temperature of about 700° C. to about 850° C.

In yet another embodiment, a NAND structure on a substrate is provided. The structure comprises a layer stack comprising alternating oxide layers and nitride layers, or alternating polycrystalline silicon layers and oxide layers, a first oxide layer formed on the layer stack, the first oxide layer having a thickness of about 10000 angstroms to about 30000 angstroms and a tensile stress of about 80 MPa to about 300 MPa, and the first oxide layer is formed using a first process gas comprising a TEOS gas and a first oxygen-containing gas, and a second oxide layer formed over the first oxide layer, the second oxide layer having a thickness of about 8000 angstroms to about 15000 angstroms, the second oxide layer is formed using a second process gas comprising a silane gas and a second oxygen-containing gas.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
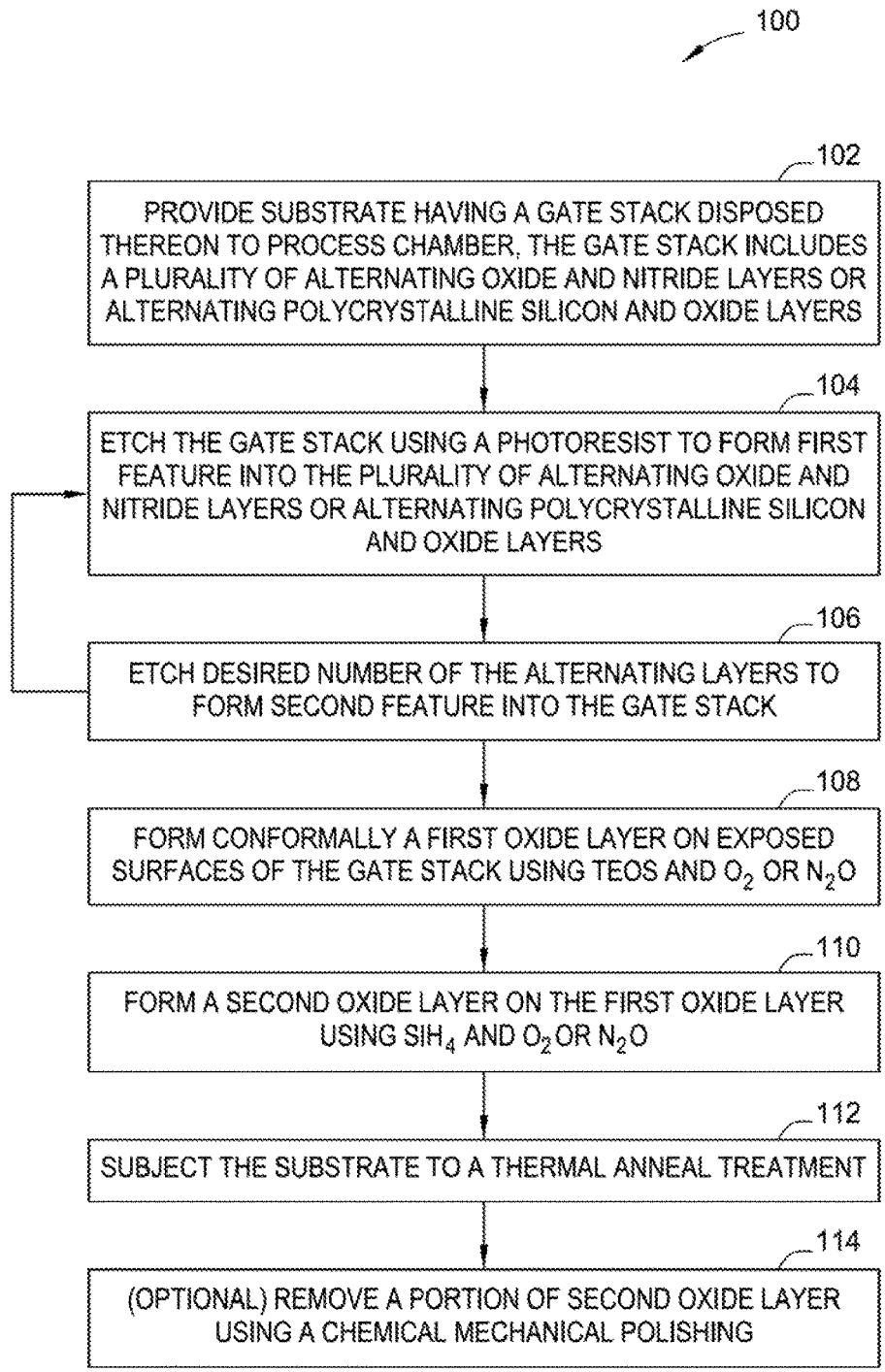
FIG. 1 depicts a method for forming three dimensional NAND structures atop a substrate in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

FIG. 1 depicts an exemplary method for forming a portion of a three dimension NAND structure atop a substrate according to embodiments of the present disclosure. FIG. 1 is illustratively described with reference to FIGS. 2A-2G, which show cross-sectional views of a substrate through various stages of a method for forming three dimensional NAND structures stop a substrate according to the flow chart of FIG. 1. Those skilled in the art will further recognize that the full process for forming a complete three dimensional NAND structure and the associated structures are not illustrated in the drawings or described herein. Instead, for simplicity and clarity, only so much of a process necessary for an understanding of the present disclosure is depicted and described. In addition, although various steps are illustrated in the drawings and described herein, no limitation regarding the order of such steps or the presence or absence of intervening steps is implied. Steps depicted or described as sequential are, unless explicitly specified, merely done so for purposes of explanation without precluding the possibility that the respective steps are actually performed in concurrent or overlapping manner, at least partially if not entirely.

The method begins at 102 where a substrate is provided to a process chamber. The process chamber may be any type of process chamber suitable to perform one or more deposition processes as described herein, for example a chemical vapor deposition (CVD) process chamber, a plasma-enhanced chemical vapor deposition (PECVD) process chamber, or any deposition chamber suitable for performing embodiments described herein.

The substrate may be any type of substrate suitable for semiconductor device fabrication. For example, referring to FIG. 2A, the substrate 200 may be a silicon substrate, for example crystalline silicon (e.g., Si<100> or Si<111>), silicon oxide, strained silicon, doped or undoped polysilicon, or the like, a III-V or II-VI compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like.

Figure 2A:
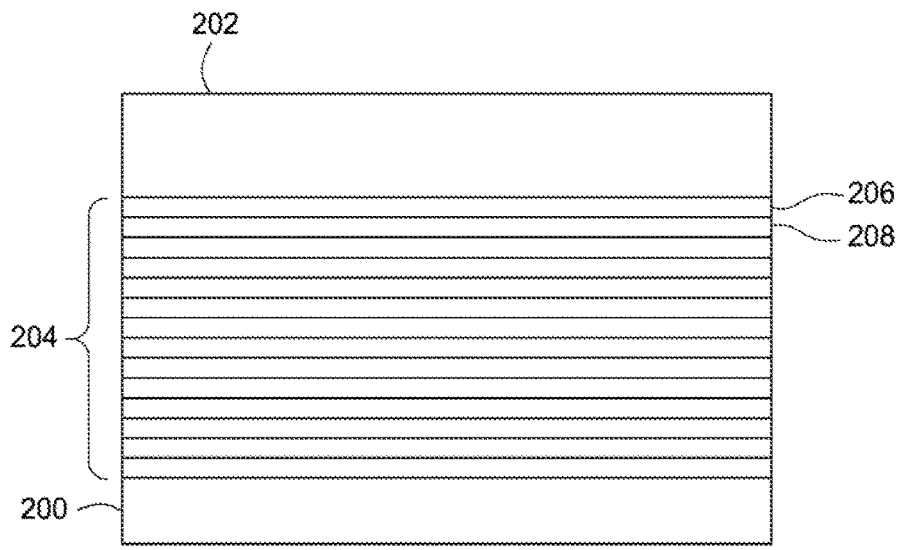
FIGS. 2A-2G respectively depict a substrate through various stages of a method for forming three dimensional NAND structures atop a substrate in accordance with some embodiments of the present disclosure.

In some embodiments, one or more layers may be disposed atop the substrate 200. For example, a gate stack 204 having a plurality of layers (e.g., layers 206, 208) may be disposed atop the substrate 200, such as shown in FIG. 2A. The plurality of layers may comprise any materials suitable to fabricate a desired device. For example, in some embodiments, the plurality of layers may include one or more polycrystalline silicon layers, one or more oxide layers, such as silicon oxide, or the like, one or more nitride layers, such as silicon nitride, or the like, or any combinations thereof. The term "polycrystalline silicon layer" contemplates that other materials, for example, such as impurities may be present in small or traceable amounts in the polycrystalline silicon layer.

In some embodiments, the plurality of layers may comprise alternating oxide layers and nitride layers, or alternating polycrystalline silicon layers and oxide layers. For example, in some embodiments, a first layer (e.g., layer 208) may comprise a nitride layer or a polycrystalline silicon layer and a second layer (e.g., layer 206) disposed atop the first layer may comprise an oxide layer. The pattern (e.g., the first layer comprising a nitride layer or poly crystalline silicon layer and the second layer comprising an oxide layer) may repeat any number of times necessary to form a gate stack 204 having a desired thickness.

Each of the layers may have any thickness suitable to facilitate fabricating a desired device. For example, in some embodiments, each of the layers may be about 100 angstroms to about 600 angstroms thick, or in some embodiments, about 300 angstroms thick. In some embodiments, the layers may all have the same thickness, or in some embodiments, the layers may have varying thicknesses.

In some embodiments, a photoresist layer 202 may be disposed atop the gate stack 204, such as shown in FIG. 2A. The photoresist layer 202 may comprise any photoresist materials suitable to provide a template to facilitate etching the gate stack 204 having desired features (e.g., as described below). For example, in some embodiments, the photoresist layer 202 may be a positive or negative photoresist and/or a DUV or EUV (deep ultraviolet or extreme ultraviolet) photoresist and may comprise one or more of polymers, organic compounds (e.g., comprising carbon, hydrogen and oxygen), an amorphous carbon, such as Advanced Patterning Film (APF), available from Applied Materials, Inc., located in Santa Clara, Calif., a tri-layer resist (e.g., a photoresist layer, a Si-rich anti-reflective coating (ARC) layer, and a carbon-rich ARC, or bottom ARC (BARC) layer), a spin-on hardmask (SOH), or the like. The photoresist layer 202 may be formed by any suitable process, for example, a patterned etch process, spin coating process, optical lithography techniques, or the like. The photoresist layer 202 may be formed to any thickness suitable to etch a desire number of features in the gate stack 204. For example, in some embodiments, the photoresist layer may be up to about 10 μm thick, for example, such as about 1 μm or about 5 μm thick.

Figure 2B:
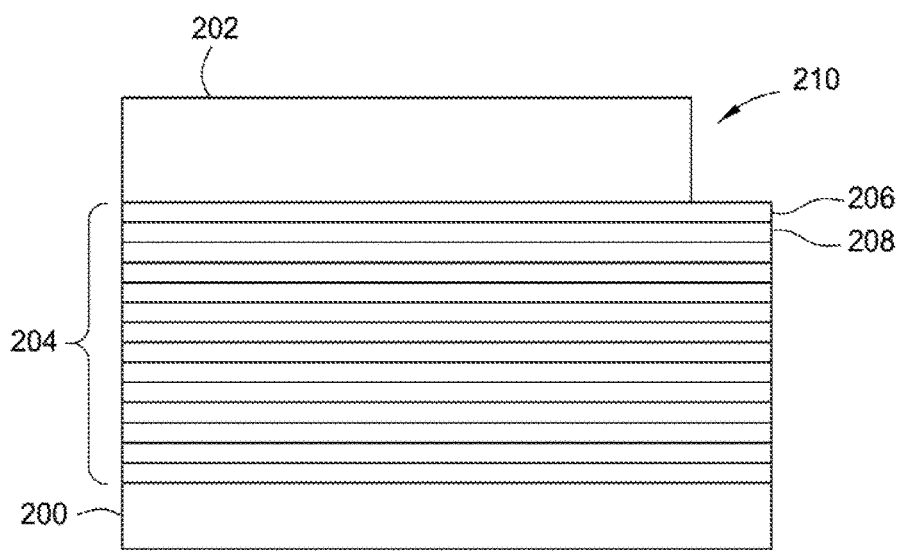

Next, at 104, the photoresist layer 202 is etched to expose at least a portion of the alternating oxide layers and nitride layers or alternating polycrystalline silicon layers and oxide layers (collectively "alternating layers") and define a feature 210 to be formed in the alternating layers of the gate stack 204, as shown in FIG. 2B. The photoresist layer 202 may be etched via any etch process suitable to selectively etch the photoresist layer 202 to define the feature 210. In some embodiments, the etch process may be an isotropic etching process to reduce a thickness and a width of the photoresist layer 202 while minimizing significant undercutting of the photoresist layer 202. For example, in some embodiments, the photoresist layer 202 may be etched via a dry etch process, such as exposing the photoresist layer 202 to an oxygen containing plasma for a desired amount of time.

Figure 2C:
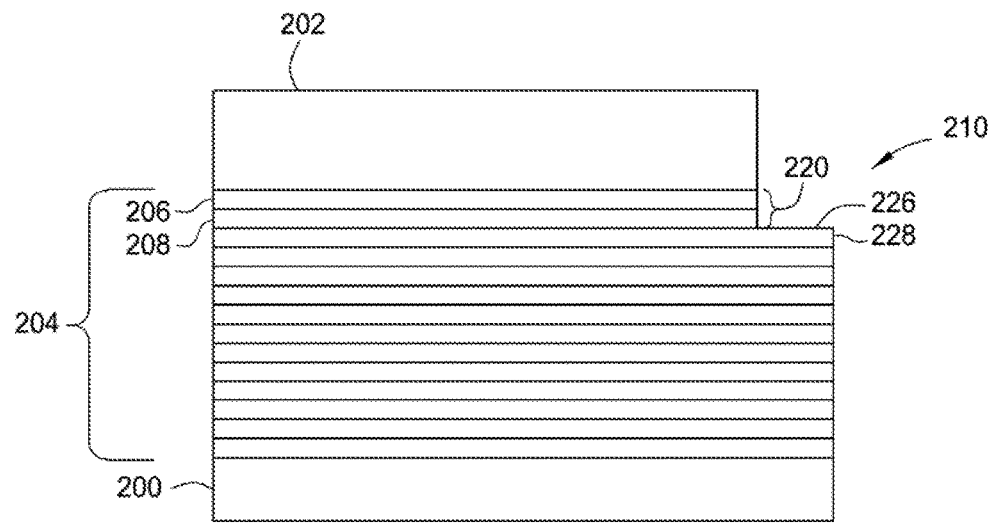

Next, at 106, a desired number of the alternating layers are etched to form a feature 212 of a NAND structure, as shown in FIG. 2C. Any number of the layers may be etched to form the feature 212. In some embodiments, the layers may be etched in sets, wherein each set includes one nitride layer or polycrystalline silicon layers and one oxide layer. In such embodiments, any number of sets may be etched, for example, from 1 to 10 sets of layers. For example, in some embodiments, a first set of layers 220 that include one nitride layer or polycrystalline silicon layer (e.g., layer 208) and one oxide layer (e.g., layer 206) may be etched to form the feature 212, such as shown in FIG. 2C. In such embodiments, the feature 212 may be etched through the nitride layer or polycrystalline silicon layer (layer 208) such that a bottom 226 of the feature 212 comprises an exposed portion of an underlying oxide layer (e.g., layer 228).

Figure 2D:
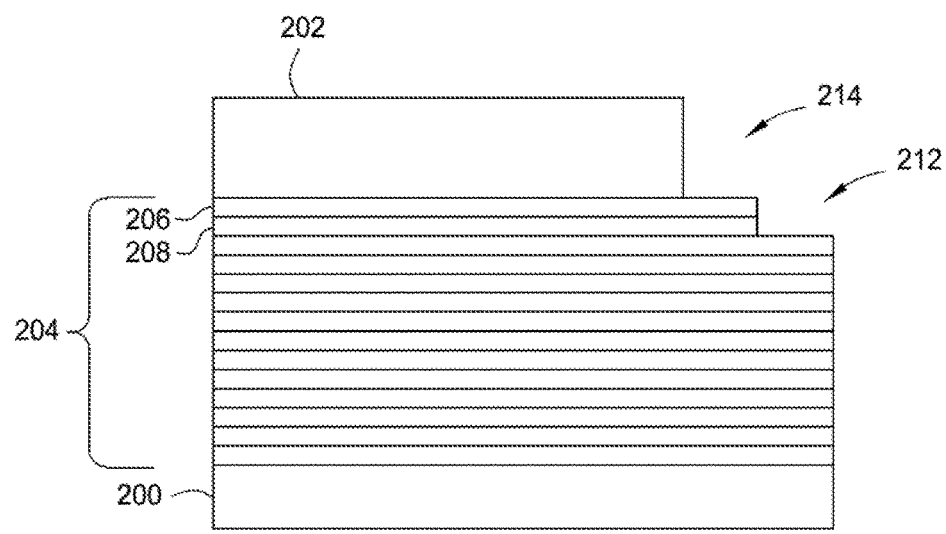
Figure 2E:
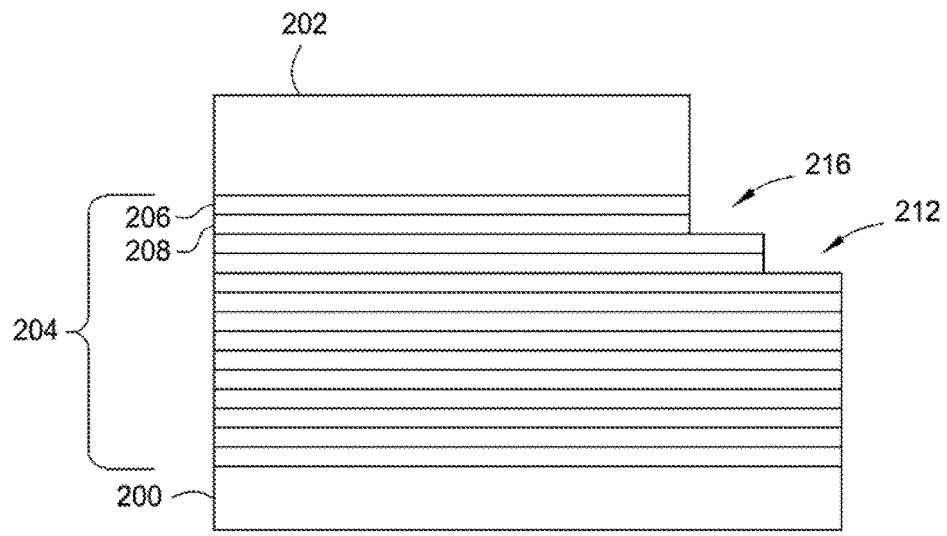

In some embodiments, after forming the feature 212 of a NAND structure at 106, the method 100 may be at least partially repeated to form additional features. In such embodiments, after forming the feature 212 of a NAND structure, at 106, the method 100 may return to 104 (as indicated by arrow 118) where the etching of the photoresist layer 202 (as described above) may be repeated to define an additional feature 214, such as shown in FIG. 2D. The method 100 may then continue through 106 again to form an additional feature 216 in the gate stack 204, as shown in FIG. 2E.

At each iteration, the exposed portions of overlaying layers of the gate stack 204 may function as a mask for the etching of underlying layers of the gate stack 204. For example, as shown in FIGS. 2D and 2E, exposed portions of layers 206, 208 function as a mask while etching the feature 216 into the layers 206, 208, thereby extending the feature 212 into the next set of layers disposed beneath the first set of layers 220.

Figure 2F:
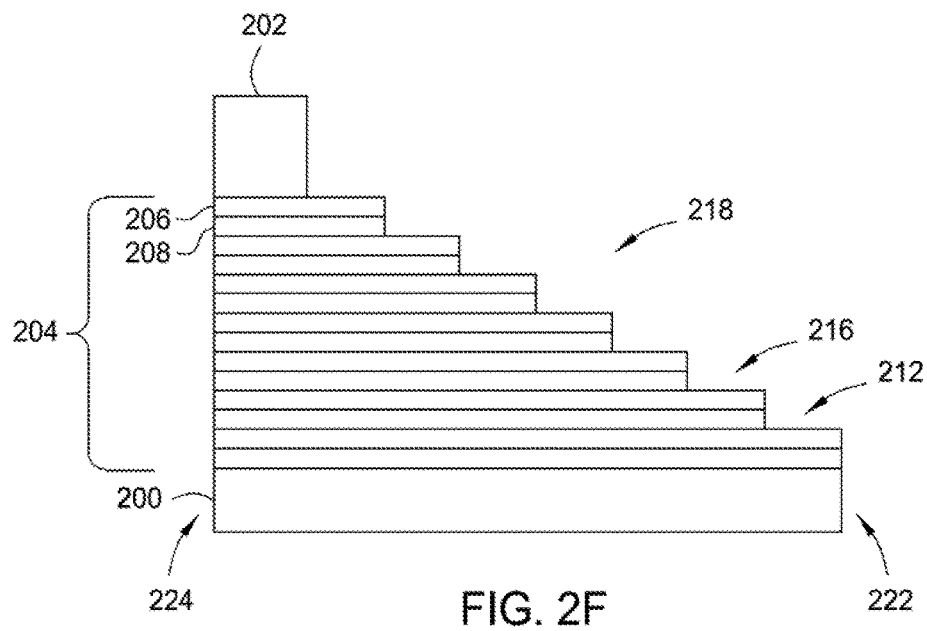

The process may be repeated any number of times to form a desired number of features to at least partially form a NAND structure. For example, in some embodiments, a plurality of adjacent features (e.g., seven features) may be formed to at least partially form a NAND structure 218 atop the substrate 200. In such embodiments, a depth of each feature of the plurality of features may decrease from an edge 222 of the substrate 200 to a center 224 of a substrate 200 to form a "staircase" cross section (e.g., a NAND staircase structure), for example, such as shown in FIG. 2F. The gate stack 204 may have a total thickness of about 1 μm to about 15 μm or above.

Figure 2G:
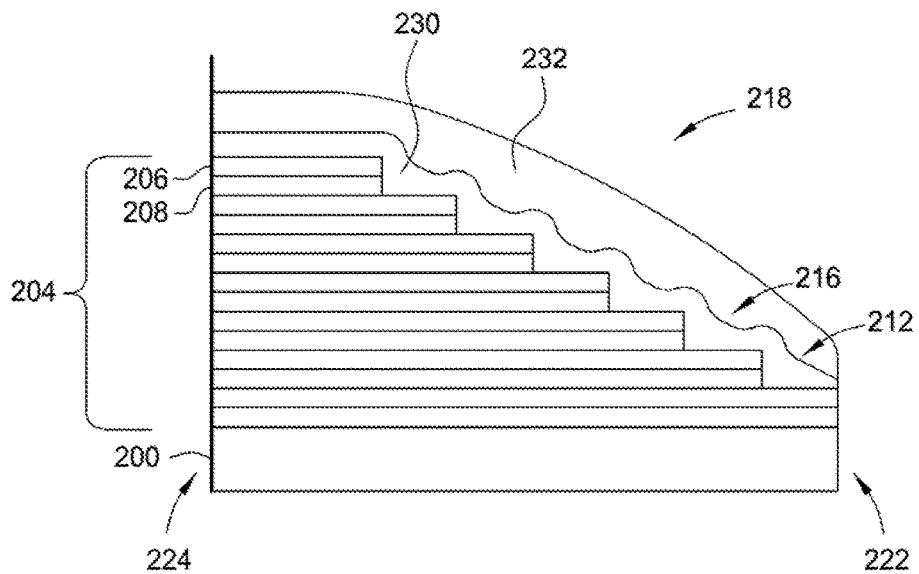

At 108, once the staircase structure has been formed, a first oxide layer 230 is conformally formed on the gate stack 204 to cover exposed surfaces of the gate stack 204, as shown in FIG. 2G. The first oxide layer 230 may be formed employing chemical vapor deposition (CVD) method, plasma-enhanced chemical vapor deposition (PECVD) method, or the like. In one embodiment, the first oxide layer 230 may be formed from a process gas comprising tetraethylorthosilicate (TEOS) and nitrous oxide ($N_2O$). In another embodiment, the first oxide layer 230 may be formed from a process gas comprising TEOS and oxygen ($O_2$). In either case, the process gas may include one or more carrier gases, for example, an inert gas such as helium (He) or argon (Ar), to facilitate delivery and distribution of the process gas within the process chamber. In one example, the process gas includes TEOS, $N_2O$ and Ar. In another example, the process gas includes TEOS, He, and $O_2$. If desired, the process gas may include a P-type or N-type dopant gas. Exemplary dopant gas may include, for example a phosphorous-containing gas or a boron-containing gas. P-doped oxides may exhibit better cracking resistance as compared to un-doped oxides. The inventors have observed that covering the gate stack 204 with the first oxide layer 230 described herein improves thermal stability of the gate stack 204 while providing good seam coverage for the underlying gate stack 204. These seam defects would otherwise appear at or near corner of the staircase structure if the gate stack 204 were covered by an oxide layer formed from silane and oxygen or nitrous oxide.

TEOS may be provided at a flow rate of about 1200 milligrams per minute (mgm) to about 8000 mgm, such as about 3000 mgm to about 6500 mgm, for example about 3700 mgm. The oxygen-containing gas (such as $N_2O$ or $O_2$) may be provided at a flow rate of about 1000 standard cubic centimeters per minute (sccm) to about 28000 sccm, such as about 1200 sccm to about 21000 sccm, for example about 1600 sccm to about 10000 sccm. Deposition of the first oxide layer 230 using a higher $O_2$: TEOS ratio, such as about 2:1 to about 6:1, for example about 3:1 to about 4:1, may help reduce or minimize stress in the NAND structure 218 by reducing the film's delta stress. Delta stress described herein is the absolute value of stress in the gate stack 204 post-anneal minus stress in the gate stack 204 pre-anneal. The first oxide layer 230 thus serves to reduce the stress differential across the substrate 200 and the gate stack 204 interface.

The carrier gas may be provided at a flow rate of about 1000 sccm to about 9000 sccm, such as about 3000 sccm to about 5400 sccm, for example about 3700 sccm. The time of flowing TEOS and oxygen-containing gas, and any carrier gas if used (i.e., gas-on time), may be about 5 seconds to about 15 seconds, for example about 10 seconds.

The chamber pressure may be about 1 to about 400 Torr, such as about 2 Torr to about 14 Torr, for example about 4.8 Torr. The chamber temperature may be about 350° C. to about 650° C., such as about 400° C. to about 600° C., for example about 550° C. The electrode spacing may be about 200 to about 550 mil, for example about 220 mil. Once the process gases have introduced into the process chamber, an RF power is provided to an electrode to ignite the process gases to form a plasma. The plasma may be formed by high frequency (HF) RF power at about 2 MHz or above, low frequency (LF) RF power at about 100 kHz to about 1 MHz, or a combination thereof. The power level of the RF power is in the range of about 5 W to about 3000 W for a 300 mm substrate. In one embodiment, the RF power is provided at about 100 W at low frequency of about 350 kHz. In one embodiment, the HF RF power is provided at about 150 W at 13.56 MHz while the LF RF is turned off. In one embodiment, the HF RF power is provided at about 300 W at 13.56 MHz while the LF RF is turned off. In one embodiment, the HF RF power is provided at about 850 W at 13.56 MHz while the LF RF is turned off. In some embodiments, the combination of HF and LF RF may be used to control the ion bombardment. In such a case, a combination of LF RF power operating at about 100 W at 350 kHz and HF RF power operating at about 300 W at 13.56 MHz may be used. The LF:HF ratio may be increased to improve film densification, thereby creating a tensile first oxide layer 230.

The deposition time may be about 150 seconds to about 350 seconds, for example about 200 seconds to about 260 seconds. The deposition rate may be about 5000 to about 10000 angstroms/min, for example about 6500 to about 7600 angstroms/min. In various embodiments, the first oxide layer 230 may be formed to a thickness of from about 5000 angstroms to about 35000 angstroms, such as about 10000 angstroms to about 30000 angstroms, for example about 15000 angstroms to about 25000 angstroms, depending on the height of the underlying gate stack. Typically, the first oxide layer 230 is formed with a tensile stress of about 80 MPa to about 300 MPa, such as about 100 MPa to about 200 MPa, for example 150 MPa.

Additional process parameters may be utilized to promote plasma ignition and stability. For example, in some embodiments, the process chamber may be maintained at a temperature of about 50° C. to about 150° C. prior to plasma ignition. In some embodiments, an inert gas, such as Ar, may be flowed into the process chamber prior to deposition of the first oxide layer 230 to help ignite the plasma.

High tensile films may be porous and have high thickness shrinkage after post-annealing process. It has been observed that film cracking due to shrinkage or stress change in the first oxide layer 230 may cause separation of a second oxide layer 232 (to be discussed below) and the gate stack 204. Therefore, in some embodiments, once the desired thickness of the first oxide layer 230 has been reached, the RF power may be optionally ramp up from 150 W to about 200 W to form an initiation layer of oxide (not shown) on the first oxide layer 230. The flowing of TEOS and the oxygen-containing gas (such as $N_2O$ or $O_2$) as well as the carrier gas (if used) may continue during the formation of the initiation layer. The increase of the RF power is believed to create a high-density oxide initiation layer and therefore help adhesion of the first oxide layer 230 to the subsequently deposited second oxide layer 232. In one embodiment, the ramping up of the RF power may continue for about 1 second to about 5 seconds, for example about 2 seconds. Additionally or alternatively, once the desired thickness of the first oxide layer 230 has been reached, the flowing of TEOS may be ramped up to create a high-density oxide initiation layer. The ramping up of the TEOS flow may continue for about 1 second to about 5 seconds, for example about 2 seconds.

Alternatively or additionally, a transition layer of oxide (not shown) may be optionally formed on the first oxide layer 230, or on the initiation layer of oxide (if present). The transition layer may be formed by increasing the RF power from about 150 W (or from 200 W if the initiation layer is desired) to about 400 W while gradually decreasing the flow of TEOS. In some embodiments, the transition layer may be formed by increasing the RF power from about 150 W (or from 200 W if the initiation layer is desired) to about 400 W while turning off the flow of TEOS to create the transition layer. The transition layer may serve as a stress relief layer to smoothen out a stress concentration at the first oxide layer 230. The initiation layer and the transition layer also provide good adhesion with the first oxide layer 230 and any subsequent layers deposited thereon.

At 110, after the first oxide layer 230 has been formed on the gate stack 204, or after the initiation and/or transition layer have been formed on the first oxide layer 230, a second oxide layer 232 is conformally deposited over the first oxide layer 230, as shown in FIG. 2G. In one embodiment, the second oxide layer 232 may be formed from a process gas comprising silane ($SiH_4$) and nitrous oxide ($N_2O$). In another embodiment, the second oxide layer 232 may be formed from a process gas comprising $SiH_4$ and oxygen ($O_2$). In either case, the process gas may include one or more carrier gases, for example, an inert gas such as helium (He) or argon (Ar), to facilitate delivery and distribution of the process gas within the process chamber. The second oxide layer 232 serves as a capping layer to protect the first oxide layer 230 by substantially isolating it from subsequent process steps such as planarization by chemical mechanical polishing (CMP), which can have significant adverse effects on the integrity and properties of the first oxide layer 230. The second oxide layer 232 also blocks the first oxide layer 230 from moisture absorption, outgassing, and undesirable chemical attack. Particularly, the inventors have observed that covering the first oxide layer 230 with the second oxide layer 232 can help prevent cracking of the first oxide layer 230 after post-annealing. Furthermore, the second oxide layer 232 can help with the stress in the underlying layer or structure. Particularly, since the first oxide layer 230 gets more compressive after anneal, the second oxide layer 232 helps to make it more tensile after anneal (and hence can have a cancelling effect).

The second oxide layer 232 and the first oxide layer 230 may be deposited in the same or different process chamber. $SiH_4$ may be provided at a flow rate of about 100 to about 600 sccm, such as about 150 to about 300 sccm, for example about 200 sccm. The oxygen-containing gas (such as $N_2O$ or $O_2$) may be provided at a flow rate of about 1000 to about 15000 sccm, such as about 2500 to about 8000 sccm, for example about 3520 to about 6480 sccm. The carrier gas may be provided at a flow rate of about 1000 to about 9000 sccm, such as about 3000 to about 5400 sccm, for example about 3500 sccm.

The chamber pressure may be about 1 to about 400 Torr, such as about 2 Torr to about 14 Torr, for example about 5.3 Torr. The chamber temperature may be about 350° C. to about 650° C., such as about 400° C. to about 600° C., for example about 550° C. The electrode spacing may be about 200 to about 550 mil, for example about 220 mil. Once the process gases have introduced into the process chamber, an RF power is provided to an electrode to ignite the process gases to form a plasma. The plasma may be formed by high frequency (HF) RF power at about 2 MHz or above, low frequency (LF) RF power at about 100 kHz to about 1 MHz, or a combination thereof. The power level of the RF power is in the range of about 5 W to about 3000 W for a 300 mm substrate. In one embodiment, the HF RF power is provided at about 300 W at 13.56 MHz while the LF RF is turned off. In one embodiment, the HF RF power is provided at about 150 W at 13.56 MHz while the LF RF is turned off. In one embodiment, the HF RF power is provided at about 850 W at 13.56 MHz while the LF RF is turned off.

The deposition time may be about 50 seconds to about 200 seconds, for example about 110 seconds. In various embodiments, the second oxide layer 232 may be formed to a thickness of from about 5000 angstroms to about 25000 angstroms, such as about 8000 angstroms to about 15000 angstroms, for example about 10000 angstroms, depending on the height of the underlying gate stack. The total thickness of the first oxide layer 230 and the second oxide layer 232 may range between about 30000 angstroms to about 50000 angstroms.

At 112, the substrate 200 is subjected to a thermal anneal treatment in a nitrogen ($N_2$) rich environment at high temperatures of about 700° C. to about 850° C., for example about 750° C. The thermal anneal treatment provides the second oxide layer 232 with a hermetic seal surface to prevent the film from cracking. The thermal anneal treatment may be performed in situ in the same process chamber for the deposition process, or may be performed in furnace or a rapid thermal annealing (RTA) chamber. The thermal anneal treatment in a furnace may be performed for an hour. For rapid thermal annealing chamber, the thermal anneal treatment may be performed for about 1 second to about 300 seconds, such as about 15 seconds to about 120 seconds, for example about 30 seconds. The thickness shrinkage after the post-annealing process is less than about 3%. This post-annealing process has been observed to provide an initial to post deposition increase in densification, as measured by thickness shrinkage, from about 10% to about 25%. It has been observed that the first oxide layer 230 with higher tensile stress may result in higher shrinkage after the thermal anneal treatment.

The thermal anneal treatment may be performed between the deposition of the first oxide layer 230 and the second oxide layer 232. For example, in some embodiments, the process sequence may include deposition of first oxide layer 230 (about 15000 angstroms in thickness)—a thermal anneal treatment—deposition of second oxide layer 232 (about 15000 angstroms in thickness). In some embodiments, the process sequence may include deposition of first oxide layer 230 (about 15000 angstroms in thickness)—a thermal anneal treatment—deposition of second oxide layer 232 (about 15000 angstroms in thickness)—a thermal anneal treatment.

At 114, an optional planarization procedure such as chemical mechanical polishing (CMP) may be performed to remove a portion of the second oxide layer 230 to a desired thickness. If desired, the planarization procedure may be performed prior to the thermal anneal treatment.

Embodiments of the present disclosure provide a bi-layer film stack for a 3D NAND staircase structure atop a substrate. The bottom oxide layer formed with TEOS and $N_2O$ or $O_2$ provide good seam coverage for the underlying gate stack, while the upper oxide layer formed with $SiH_4$ and $N_2O$ or $O_2$ isolates the bottom oxide layer from moisture absorption, outgassing, and undesirable chemical attack, as well as cracking of the bottom oxide layer after post-annealing process. Bottom oxide layer formed with TEOS and $N_2O$ and hermetic upper oxide layer enables high quality tensile oxide film stack for the NAND staircase structure.

While the foregoing is directed to embodiments of the present disclosure, other and further embodiments of the disclosure may be devised without departing from the basic scope thereof.

The invention claimed is:

1. A method for processing a substrate, comprising:
   positioning a substrate having a gate stack deposited thereon, the gate stack comprising a plurality of oxide layers and a plurality of nitride layers disposed alternatingly in a vertical arrangement perpendicular to a top surface of the substrate, and the gate stack having a staircase cross section;
   forming on exposed surfaces of the gate stack a first oxide layer using a first RF power of about 150 W and a first process gas comprising a TEOS gas and a first oxygen-containing gas;
   after the first oxide layer has reached a predetermined thickness, ramping up the first RF power to form an initiation layer of oxide over the first oxide layer;
   after the initiation layer has reached a predetermined thickness, ramping up the RF power used to form the initiation layer while gradually decreasing the flow of the TEOS gas to form a transition layer of oxide on the initiation layer; and then
   forming a second oxide layer over the transition layer using a second RF power that is different from the first RF power and a second process gas comprising a silane gas and a second oxygen-containing gas.

2. The method of claim 1, wherein each of the first and second oxygen-containing gases comprises $O_2$ or $N_2O$.

3. The method of claim 1, wherein the first oxygen-containing gas and the TEOS gas are provided at first oxygen-containing gas:TEOS gas ratio of about 2:1 to about 6:1.

4. The method of claim 1, wherein the first process gas further comprises a P-type or N-type dopant gas.

5. The method of claim 1, wherein the first oxide layer has a tensile stress of about 80 MPa to about 300 MPa.

6. The method of claim 1, wherein the first oxide layer has a thickness of about 10000 angstroms to about 30000 angstroms, and the second oxide layer has a thickness of about 8000 angstroms to about 15000 angstroms.

7. The method of claim 1, further comprising:
   after forming the second oxide layer, subjecting the substrate to a thermal anneal treatment in a nitrogen rich environment at a temperature of about 700° C. to about 850° C.

8. The method of claim 1, wherein the initiation layer is formed by ramping up the first RF power from about 150 W to about 200 W.

9. The method of claim 8, wherein the transition layer is formed by ramping up the RF power used to form the initiation layer from about 200 W to about 400 W.

10. A method for processing a substrate, comprising:
    positioning a substrate having a gate stack deposited thereon;
    forming a first oxide layer conformally on exposed surfaces of the gate stack using a first RF power of about 150 W and a first process gas comprising a TEOS gas and a first oxygen-containing gas;
    after the first oxide layer has reached a predetermined thickness, ramping up the first RF power while continuing the flow of the TEOS gas and the first oxygen-containing gas to form an initiation layer of oxide over the first oxide layer;
    after the initiation layer has reached a predetermined thickness, increasing the RF power used to form the initiation layer while gradually decreasing the flow of the TEOS gas to form a transition layer of oxide on the initiation layer; and then
    forming a second oxide layer conformally over the transition layer using a second RF power that is different from the first RF power and a second process gas comprising a silane gas and a second oxygen-containing gas.

* * * * *